United States Patent [19]
Whitefield

[11] Patent Number: 5,652,722
[45] Date of Patent: Jul. 29, 1997

[54] SYSTEM AND METHOD FOR CONTROLLING VOLTAGE AND CURRENT CHARACTERISTICS OF BIT LINES IN A MEMORY ARRAY

[75] Inventor: Colin Whitefield, Bristol, United Kingdom

[73] Assignee: SGS-Thomson Microelectronics Limited, Bristol, United Kingdom

[21] Appl. No.: 519,194

[22] Filed: Aug. 25, 1995

[30] Foreign Application Priority Data

Aug. 26, 1994 [GB] United Kingdom ............... 9417264

[51] Int. Cl.$^6$ ............................................. G11C 16/02
[52] U.S. Cl. ......................... 365/185.23; 365/185.18; 365/185.25; 365/189.11
[58] Field of Search ........................ 365/185.23, 185.2, 365/185.25, 201, 189.11, 185.18

[56] References Cited

U.S. PATENT DOCUMENTS

| | | | |
|---|---|---|---|
| 5,016,218 | 5/1991 | Yamazaki | 365/185.23 |
| 5,253,201 | 10/1993 | Atsumi | 365/185.23 |
| 5,398,203 | 3/1995 | Prickett | 365/185.18 |
| 5,444,656 | 8/1995 | Bauer | 365/185.2 |
| 5,469,384 | 11/1995 | Lacey | 365/185.13 |

FOREIGN PATENT DOCUMENTS

| | | | |
|---|---|---|---|
| 0 525 676 | 2/1993 | European Pat. Off. | G11C 11/419 |
| 62-150758 | 7/1987 | Japan | H01L 27/04 |
| 41 03 160 | 4/1992 | Japan | H01L 27/04 |
| 2 209 871 | 5/1989 | United Kingdom | H01L 21/66 |
| 2 214 380 | 8/1989 | United Kingdom | G11C 17/00 |

OTHER PUBLICATIONS

Hoff et al., "A 23-ns 256K EPROM with Double-Layer Metal and Address Transition Detection," *IEEE Journal of Solid-State Circuits* 24:5, Oct., 1989, pp. 1250–1258.

*Primary Examiner*—David C. Nelms
*Assistant Examiner*—Son Mai
*Attorney, Agent, or Firm*—David V. Carlson; Seed and Berry LLP

[57] ABSTRACT

A memory array has a floating gate transistor cell connected to a bit line and a bit line driver circuit comprising a variable impedance FET and an active load powering the bit line from a supply node. A control circuit selects a voltage applied to the gate of the variable impedance FET to control the bit line voltage, e.g., in dependence on parameters of the cell.

26 Claims, 9 Drawing Sheets

FIG. 11

| | SELECTED CELL | | | UNSELECTED CELL SAME ROW | | | UNSELECTED CELL SAME COLUMN | | |
|---|---|---|---|---|---|---|---|---|---|
| | DRAIN VOLTAGE | GATE VOLTAGE | SOURCE VOLTAGE | DRAIN VOLTAGE | GATE VOLTAGE | SOURCE VOLTAGE | DRAIN VOLTAGE | GATE VOLTAGE | SOURCE VOLTAGE |
| PROGRAM | ~5V | $V_{PP}$ | $V_{GND}$ | $V_{GND}$ | $V_{PP}$ | $V_{GND}$ | ~5V | $V_{GND}$ | $V_{GND}$ |
| ERASE* | FLOATS | $V_{GND}$ | $V_{PP}$ | FLOATS | $V_{GND}$ | $V_{PP}$ | FLOATS | $V_{GND}$ | $V_{PP}$ |
| READ | PRECHARGED TO ~1V | ~5V | $V_{GND}$ | $V_{GND}$ | ~5V | $V_{GND}$ | PRECHARGED TO ~1V | $V_{GND}$ | $V_{GND}$ |

* ALL CELLS SELECTED IN ERASE

SYSTEM AND METHOD FOR CONTROLLING VOLTAGE AND CURRENT CHARACTERISTICS OF BIT LINES IN A MEMORY ARRAY

TECHNICAL FIELD

The present invention relates to a method and apparatus for controlling voltage and current characteristics in a voltage supply line for a memory cell; and, more especially but not exclusively, to a method and apparatus for programmable control of a loadline in a flash memory cell or flash EPROM.

BACKGROUND OF THE INVENTION

Referring to FIG. 9, a flash memory cell consists of a single field effect transistor 2 having a floating gate FG which is used to set the state of the cell, and a control gate CG connected to a word line 8. As described later herein, application of programming voltages to the control gate, the source and the drain of a quiescent cell causes charge to be stored on the floating gate, whereby the cell assumes a condition referred to as a logical zero. The control gate, in cooperation with an erase voltage applied to the source via a line 10 can remove previously-stored charge on the floating gate, thus restoring the cell to the quiescent condition referred to as logical one. Flash memories have the ability to erase simultaneously all the cells of a portion of the memory, rather than to erase single cells. Application of read voltages to the cell enables determination of whether the cell is at the time storing a logical one or logical zero.

During the above-mentioned programming operation, which may be carded out one cell at a time, the source electrode—which is connected in common to source electrodes of other cells of the array by a source line 10 hereinafter referred to as the array ground line—is connected to a reference potential, such as ground. The control gate voltage of a cell to be programmed to logical zero is set at a relatively high voltage Vpp, such as plus 12 volts. The drains of pluralities of cells are connected together at respective bitlines and power applied to each bitline 6 to produce a predetermined voltage on the bitline, when a cell on that bit line is to be programmed.

Conveniently, the power may be applied to the bitline (and hence the drain electrode of a transistor to be programmed) by a source follower FET SF for connecting a supply voltage, e.g., the above-mentioned relatively high voltage Vpp to the bitline 6 via a load 32. The source follower has a gate driven by a stable voltage VST from a voltage regulator and a channel connected at one end to the bitline and at the other end to a supply source via the load 32. Thus, cell drain, or bitline, voltage during programming is determined at least in part by the output impedance of the source follower. This is because a source follower acts as a resistor whose value depends on the gate voltage applied thereto, —i.e. the level of current passed by the source follower depends on the gate voltage. When the source follower drain is at a constant voltage, the bitline voltage at the source of the source follower drops as current demand increases, and conversely rises as current demand falls.

During programming, as mentioned above, the control gate of a cell to be programmed receives a fixed relatively high voltage Vpp. The current drawn by the channel of the cell being programmed varies in the programming cycle between an initially high current demand and a later reduced current demand. Hence, application of a memory cell being programmed to the above-mentioned source follower gives rise to a voltage variation on the bitline as the current demand changes. When the memory cell channel current is high, the impedance of the source follower drops a relatively large voltage and therefore bitline voltage is relatively low, and as the current demand through the cell decreases, the bitline voltage rises. The relationship of bitline voltage to load current is referred to herein as the bitline loadline.

Since a source follower may be provided for each bitline, it is desirable that the source follower be physically small to minimize overall chip area demands. On the other hand, it is desirable to have a minimum source follower impedance when the source follower is turned on, i.e., during programming. As near as possible a constant cell voltage with variation of cell current is desired. This requirement tends towards use of a relatively large source follower. Consequently, any practical solution must be a compromise between the two requirements.

Two constraints on cell drain voltage are snap back and the time taken to achieve programming. These two effects are described later herein, and it suffices here to state that if the cell drain voltage exceeds an upper limit, snap back occurs and if cell drain voltage is below a lower limit, the time taken for programming will be unacceptably long.

As mentioned above, cell characteristics cause cell drain voltage to vary between initially low and later higher values during the course of programming. The cell drain voltage will also be influenced by other effects, such as temperature, supply voltage tolerances and process variations. The global maximum drain voltage resulting from all effects needs to be low enough to avoid snap back. The global minimum must be high enough to achieve sufficiently rapid programming to result in a satisfactory programming time.

It has been found that the level of drain voltage causing snap back and the drain voltage providing a maximum satisfactory programming time are dependent on the effective length of the cell. As the effective cell length increases, the snap back voltage, representing an upper limit to drain voltage, increases. Increase of effective cell length also causes the drain voltage for a particular duration of programming time to increase. Thus for a 'short' cell, a relatively low first level of drain voltage causes snap back and a low second level of drain voltage provides reasonable programming time. For a 'long' cell, a higher third level of drain voltage is allowable before snap back occurs and a higher fourth level of drain voltage provides the same reasonable programming time.

In one arrangement, the stable voltage VST applied to the source follower is selected to be a single value for an expected range of cell lengths. The voltage value selected must therefore set a loadline having a maximum drain voltage (corresponding to minimum cell channel current during programming) below the drain voltage causing snap back in a short cell and a minimum drain voltage (corresponding to maximum cell channel current during programming) above that voltage needed to give a selected programming time for a long cell. These two limits severely restrict the operation of the device.

Accordingly it is an object of the present invention to at least partially mitigate the above-mentioned disadvantage.

SUMMARY OF THE INVENTION

According to a first aspect of the present invention, there is provided, a memory cell having a floating gate transistor with a drain, the drain being connected to a bit line, the memory cell comprising means whereby the voltage of the bit line is controlled to provide a desired loadline of the bit line.

According to a second aspect of the present invention, there is provided a non-volatile memory array having a plurality of memory cells, each cell being connected to one of a plurality of bit lines; the memory array comprising means whereby the voltage of the bit lines is controlled to provided a desired loadline of the bit lines.

According to a further aspect of a non-volatile memory array of the present invention, there is provided a means of determining the effective electrical length of the memory cell.

According to a still further aspect of a non-volatile memory array of the present invention there is provided a non-volatile memory with a plurality of variable impedance circuits each having a voltage supply line, a control node, and a controlled impedance circuit connected between the voltage supply line and one of the bit lines. Also provided is a control voltage regulator circuit for applying a voltage to each of the control nodes and means of programming the voltage regulator circuit to set the value of the voltage of the bit lines.

According to a third aspect of the present invention, there is provided a memory cell comprising a floating gate transistor connected to a bit line and a driver circuit connected to the bit line to apply a voltage to the bit line within a required voltage range during programming of the cell. The driver circuit is comprised of a voltage supply line, a controlled variable impedance circuit connected between the voltage supply line and the bit line, a control node for controlling the impedance of the variable impedance circuit, and control voltage selector circuitry connected to the control node to select a voltage to be applied to the control node and thereby control a loadline of the bit line.

According to a fourth aspect of the present invention, there is provided a method of controlling the loadline of a bitline in a floating gate transistor memory cell. The bitline has bitline driver circuitry receiving a control voltage which may be varied to alter the loadline position. The method comprises the steps of determining the effective electrical length of the cell transistor and programming the control voltage applied to the bitline driver circuitry based on the effective transistor length whereby a desired loadline may be achieved.

According to a fifth aspect of the present invention, there is provided a voltage control circuit for controlling a bit line voltage of a memory cell in a flash memory array. The circuit has variable impedance circuitry, including a control node, connected between a voltage supply and the bit line, voltage regulator circuitry for regulating a voltage applied to the control node to vary the impedance of the variable impedance circuitry, and programming circuitry connected to the voltage regulator circuitry for selecting the voltage applied by the voltage regulator circuitry to the control node.

According to a further aspect of the invention there is provided a non-volatile memory array with a plurality of memory cells, each cell being coupled to a respective one of a plurality of bit lines whereby a programming voltage may be applied to selected cells. Each of the bit lines has a variable impedance circuit connected between a voltage supply and the respective bit line, and each variable impedance circuit has a respective control node. The memory array also has voltage regulator circuitry for applying a voltage to each control node and control circuitry for selecting the value of the voltage. Therefore, the voltage may be set after manufacture of said array.

According to a yet further aspect of the present invention, there is provided a method of determining a loadline of a line driver in an integrated circuit. The method comprises the steps of providing a test line-driver with a control node, applying a control signal to the control nodes of the line driver and the test line driver, applying a predetermined current sink to an output of the test line driver, and measuring the voltage at the output as a measure of the loadline.

According to a further aspect of the present invention there is provided a method of determining the effective electrical length of a floating gate memory cell comprising the steps of providing a test cell with a memory cell having a floating gate and a control gate galvanically connected together and a channel, supplying a predetermined voltage to the control gate of the test cell, applying a predetermined voltage across the channel of the test cell, and measuring the current flow through the test cell to establish the transconductance thereof whereby the effective electrical cell length may be computed.

According to a still further aspect of the present invention, there is provided a circuit for measuring the effective electrical length of a floating gate memory cell using an EPM device. An EPM device is a memory cell having a channel, a floating gate and a control gate with the floating gate being galvanically connected to the control gate. The circuit also includes test circuitry for applying a predetermined potential to the control gate of the EPM device and for applying a predetermined(potential across the channel of the EPM device, and measuring circuitry, for measuring the current flow through the EPM device for determining the transconductance of the EPM device whereby the effective electrical cell length may be determined.

BRIEF DESCRIPTION OF THE DRAWINGS

The invention will now be described, by way of example only, with reference to the accompanying drawings in which:

FIG. 11 is a table of voltages applied to floating gate cells in a flash memory array.

In the figures like reference numerals indicate like parts.

DETAILED DESCRIPTION OF THE INVENTION

When programming a single transistor memory cell in a flash EPROM of this example, it is necessary to provide a drain voltage which is held within certain upper and lower voltage limits in order to complete a programming cycle with reliability of correct data entry into the cell. The current drawn by the cell during the programming cycle will vary and so a voltage source for the bit line to which the transistor drain is connected, is required to provide a voltage which remains within these upper and lower limits regardless of the current through the bit line, and regardless of the effects of temperature, supply tolerances and process variations.

Figure 1:
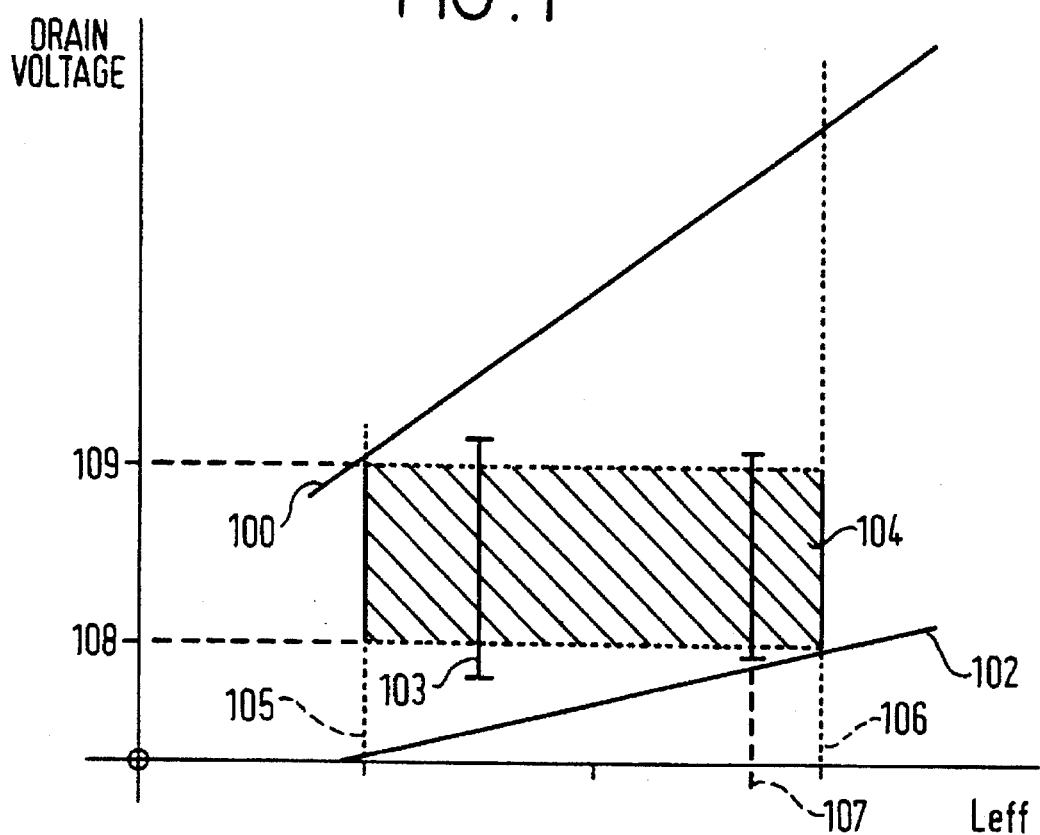
FIG. 1 is a diagrammatical representation of the variation in drain voltage giving rise to snap back and the variation in drain voltage giving a predetermined programming time, both variations with effective cell length and a working bit line voltage range of a non-volatile flash memory cell.

FIG. 1 shows drain voltage against effective length for a single transistor memory cell used in a flash EPROM and reference numeral 100 indicates the maximum drain voltage relative to effective length without causing snap back. Snap back is a destructive effect within a FET which has previously been identified as due to parasitic devices in the FET structure. Voltages within the structure may cause the parasitic devices to turn on, and provide undesirably high current flows, possibly leading to damage. In the case of a floating gate FET cell being programmed, the control gate is held at the previously-discussed relatively high voltage Vpp of for example plus 12 volts. It has been found that, under these conditions, if the drain voltage exceeds an upper limit, the floating gate FET cell may experience snap back. The actual limit value is both process dependent and also dependent on the length of the cell. The maximum drain voltage applied to a cell must accordingly remain below the snap back level.

It will be seen that the snap back characteristic is such that for cells of increasing effective electrical lengths of cells, higher drain voltages are permissible before snap back occurs.

Reference numeral 102 indicates the programming time characteristic, i.e. the minimum-drain voltage necessary to achieve a maximum permitted programming time such as 5 micro seconds, for a programming cycle. This characteristic is plotted against effective electrical cell length.

As the length of a floating gate cell increases, the voltage applied across the channel must increase if a predetermined time for programming is to be achieved. Hence, it will be seen that with increasing effective electrical cell length, the programming time characteristic rises. The programming time characteristic shown in FIG. 1 is selected to be a limit value representing the voltage which is needed to provide the maximum acceptable programming time.

Reference numeral 103 indicates the voltage variation which may be experienced by a cell being programmed. This variation is due in part to changing cell current during a programming cycle, which causes variation in applied voltage, and in part to tolerances in voltage supply level, variations in temperature and process values.

Figure 2:
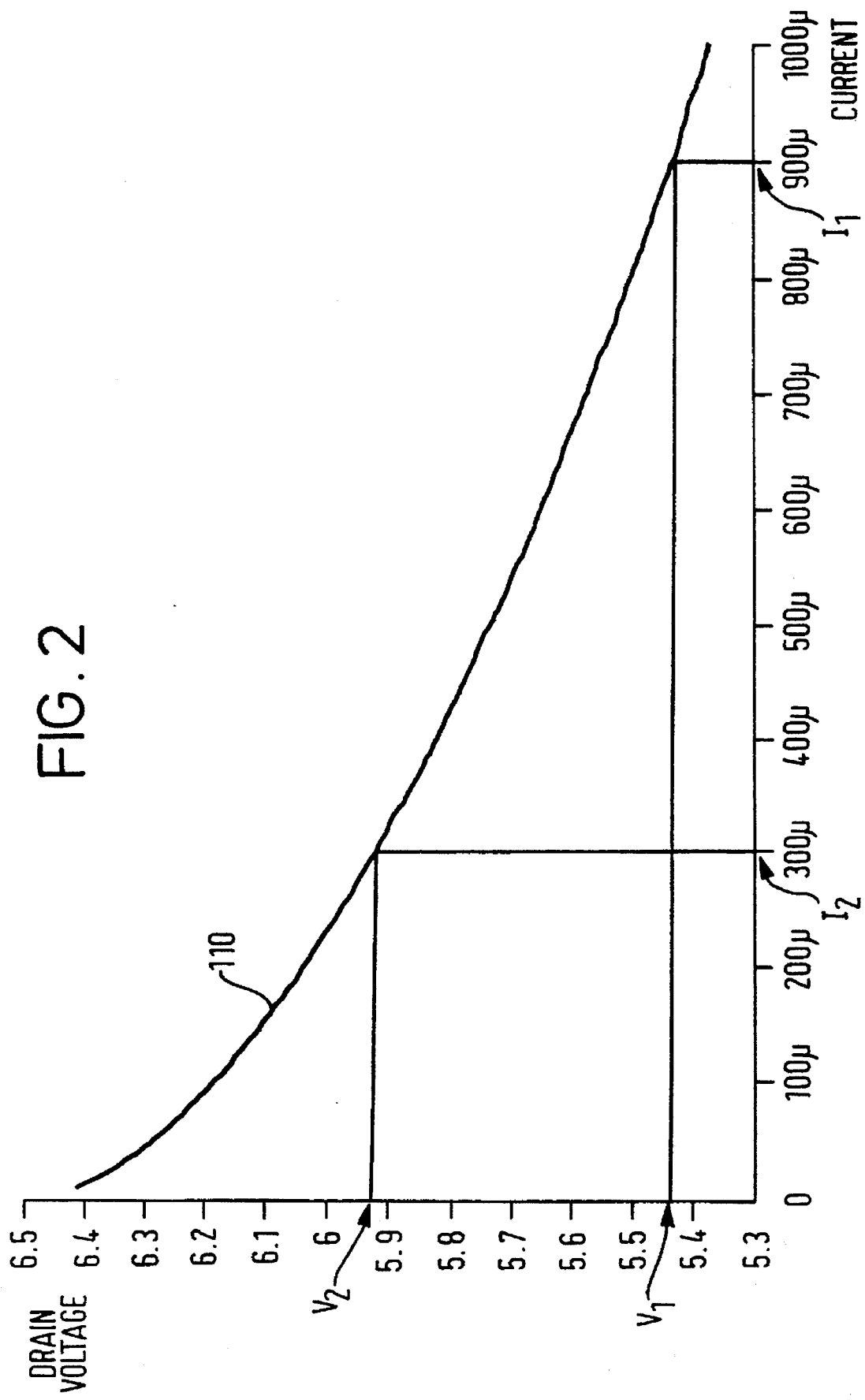
FIG. 2 is a diagram showing a bitline loadline for a non-volatile flash memory cell.

Referring now to FIG. 2, reference numeral 110 shows a bitline loadline i.e., the relationship of drain voltage to channel current for a flash memory cell transistor having a source follower FET supplying the bitline (cell drain) voltage, connected to the cell transistor drain. When a cell is to be programmed, a relatively high voltage of for example 12 volts is applied to the control gate of the cell and this initially causes the cell to draw a channel current shown on FIG. 2 at point I1. For such a current, the source follower produces a bitline voltage of V1 on the cell drain. During the programming cycle the current demand by the channel of the cell being programmed falls to a second level I2. For this current, the source follower produces a bitline voltage of V2. The voltage range V1–V2 will be increased by the above supply, temperature and process variations, and the full extent of the range is represented by the line referenced 103 in FIG. 1.

Referring again to FIG. 1, reference numeral 104 indicates a drain voltage range which would allow operation of a cell having a length between two values 105 and 106 of effective electrical cell length. These values represent the extreme cell length values which may be encountered in different memory arrays. A minimum drain voltage 108 of the drain voltage range corresponds to the drain voltage defined by the programming time characteristic for the maximum cell length 106, whereas the maximum voltage 109 is that defined by the snap back characteristic for the minimum cell length 105.

Use of this single range regardless of cell length restricts the drain voltage variation which can be used for any particular cell. For example where an actual cell has a length 107, although the minimum drain voltage value of the range 104 is close to the correct value for the actual cell 107, a considerably higher voltage excursion than the maximum of range 104 could be allowed in cell 107 without crossing the snap back characteristic. Furthermore, the mid point of the drain voltage range for cell 107 could be higher.

The embodiments described avoid restricting the drain voltage range in this way by taking account of effective electrical length of the cell. Thus the drain voltage range for a cell of a particular length has a mid point placed approximately midway between the levels of drain voltages defined by the snap back and programming time characteristics for that length of cell. This gives an increased allowable variation of drain voltage, and at the same time decreased programming times would be achieved. In turn larger temperature or supply voltage variations are tolerated by the memory.

Figure 3:
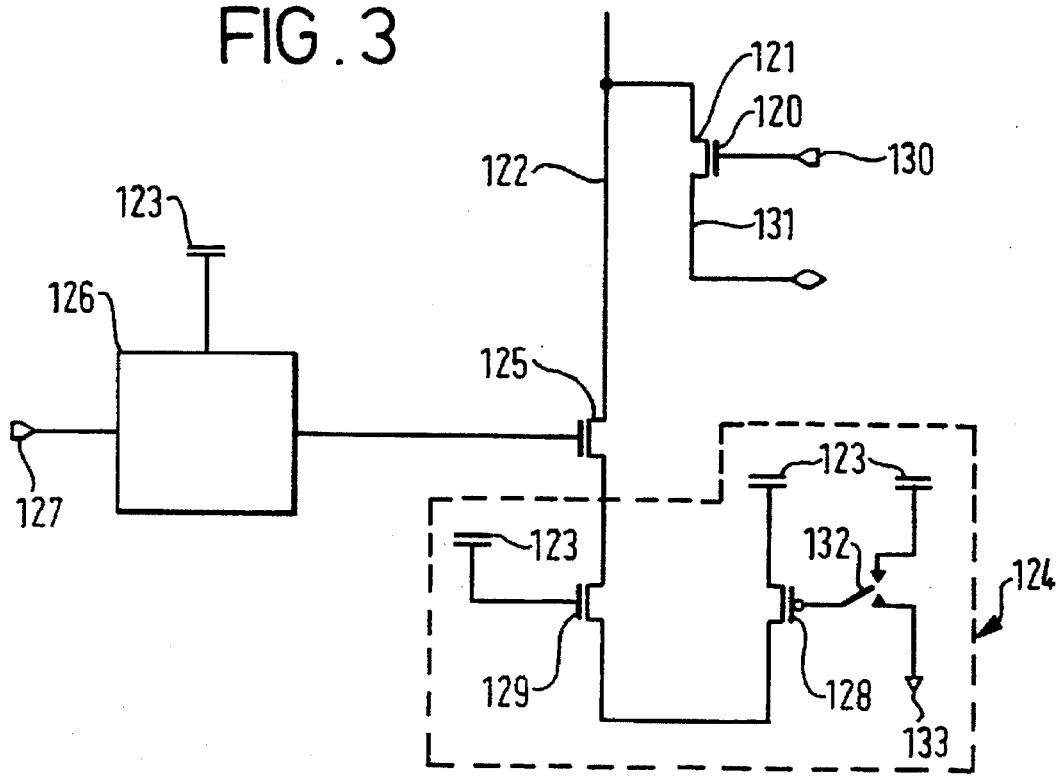
FIG. 3 is a circuit diagram of a control arrangement for setting the programming conditions in a non-volatile floating gate memory cell.

Referring to FIG. 3, a floating gate memory cell 120 for a flash EPROM has a drain 121 which is connected to a bitline 122. The bitline 122 is also connected to other memory cells in an array, not shown. The bitline 122 is further connected to a voltage supply 123 at a level Vpp of around 12 volts via the channel of a source follower FET 125 and an active load 124, consisting of the series connection of a p-channel FET 128 and an n-channel FET 129. The gate of the p-channel FET 128 is switchable, as shown figuratively in FIG. 3 by switch 132. When the gate is connected to the ground node 133, the FET 128 is turned on for enabling the active load during programming. When the gate is connected to supply node 123, the FET 128 is off, disconnecting the active load. The gate of the source follower 125 is supplied by a voltage regulator 126 which has a control input 127, and a supply input to node 123, receiving Vpp.

In operation where it is desired to program the cell 120 the gate terminal 130 of the cell is supplied with a high voltage Vpp, for example 12 volts and the source 131 of the cell is pulled down to ground potential. As is well known in the art, the source terminals 131 of plural memory cells may be connected in common and a substantial time may elapse before the sources are pulled down to ground potential. After this time has elapsed, the gate of FET 128 is coupled to node 133 to turn on the FET 128 and the first input terminal 127 to the voltage regulator 126 is supplied with an "on" potential, which causes the voltage regulator 126 to supply a stable voltage to the gate of the source follower FET 125. The effect of this stable voltage is to cause the source follower to turn on, connecting bitline 122 to the supply voltage node 123 via the active load 124.

During programming, the cell 120 initially draws a relatively high current from bitline 122 but the level of this current falls during the programming operation. The impedance of the source follower FET 125 and the active load 124 provides a voltage on the bitline 122 which is initially relatively low, but rises to a relatively high value, as shown in FIG. 2.

Figure 4:
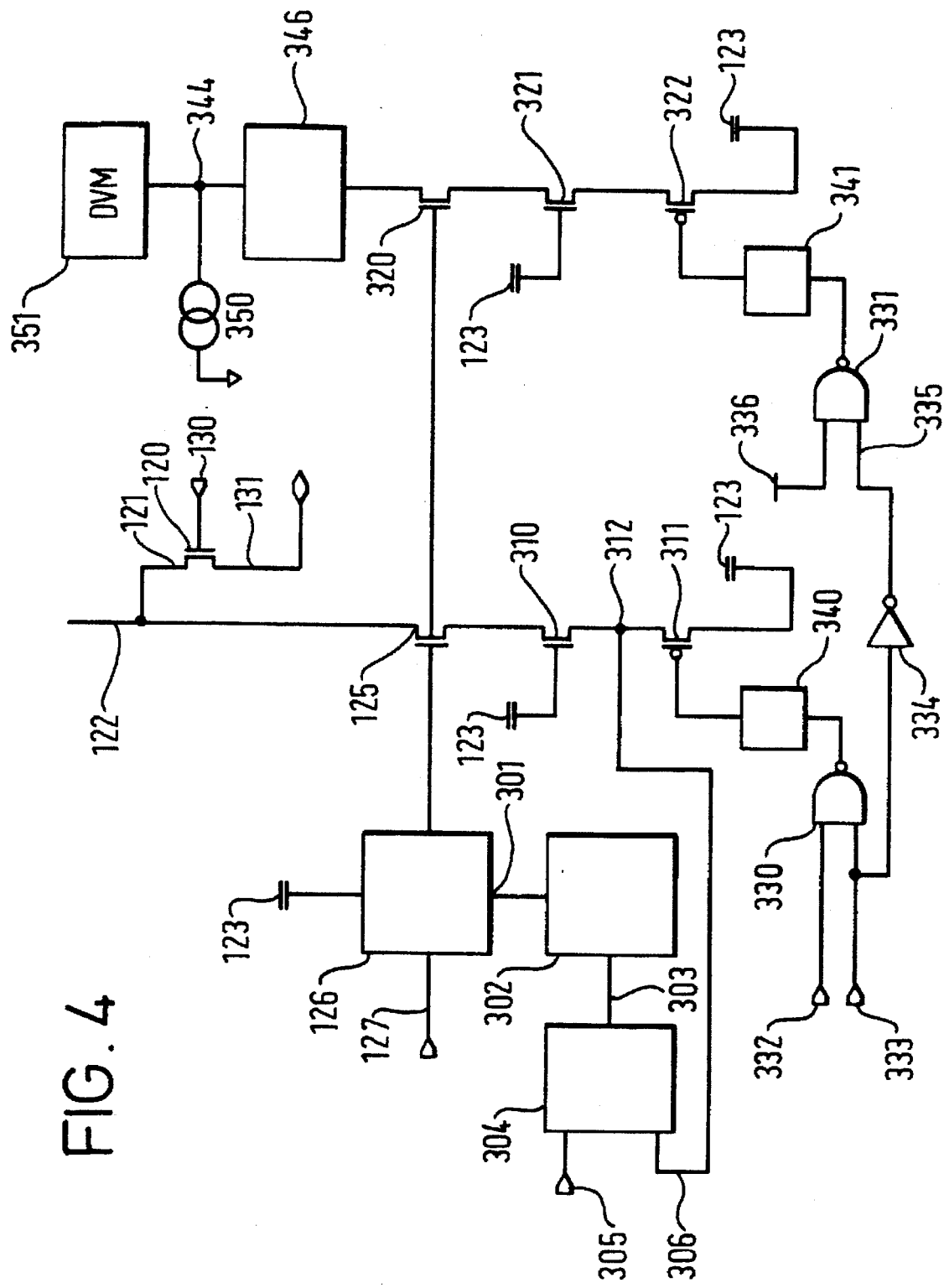
FIG. 4 shows an embodiment of an apparatus for loadline positioning in a non-volatile memory cell in accordance with the invention.

Referring now to FIG. 4, a similar floating gate memory cell 120 has a bitline 122 connected to a voltage supply 123 via a source follower FET 125, to whose gate is connected a voltage regulator 126. However, in this case, the voltage regulator not only has a first control terminal 127 but also has a second control terminal 301 to which is connected a voltage regulator control circuit 302. The voltage regulator control circuit 302 in turn has a control input 303 which is connected to a latch circuit 304 which has a variety of output signals on line 303 to vary the operation of the voltage regulator 126 to select a desired voltage range for the bit line 122 during a programming cycle. The latch circuit 304 has a first control input 305 and a second control input 306 to vary the setting of the latch circuit 304.

In the presently described embodiment, the latch circuit 304 consists of plural so-called "UPROM" devices, each of which has two cross-coupled floating gate single transistor cells. One of the cells is programmed to logical zero to provide an output signal for the UPROM device at logical one, and the other of the cells is programmed to logical zero to provide a device output of logical zero.

The channel of the source follower FET 125 is connected via an active load, being the series connected channels of a first n-channel FET 310 and a first p-channel FET 311, to the voltage supply terminal 123. A node 312 common to the first n and first p channel FETs 310, 311 is connected to the second control terminal of the latch circuit 304. The gate of the first n-channel FET 310 is connected to positive supply terminal 123 supply terminal 123 which in this example is the same 12 volt Vpp supply used for the supply terminal 123 which in this example is the area 12 volt Vpp supply used for the gate of the cell transistor 120.

The circuit also has a test branch which includes a test branch source follower FET 320 and a test branch load arrangement which includes the series connection of the channels of a test branch n-channel FET 321 and a test branch p-channel FET 322. The gate of the test branch n-channel FET is connected to the supply node 123 and the remote end of the channel of the test branch p-channel FET 322 is also connected to the positive supply node 123.

The gates of the first p-channel FET 311 and the test branch p-channel FET 322 are connected to a control circuit. The control circuit is operated from a second positive supply Vcc of a level less than the previously-described relatively high Vpp level. The control circuit consists of a first two input NAND gate 330 having an output connected to the gate of the first p-channel FET 311 via a first interface 340, and a second two input NAND gate 331 having an output connected to the gate of the test branch p-channel FET 322 via a second interface 341. The first and second interfaces 340, 341 allow reliable switching of the respective p-FET 311, 322, which have drain potentials of around 12 volts by the NAND gates 330, 331 which have outputs at much lower voltages, e.g., 3 volts. One example of a circuit of an interface is described later herein with reference to FIG. 8 of the accompanying drawings. In the presently described embodiment, the interfaces 340, 341 are non-inverting devices—i.e., a high input gives rise to a high output level and vice-versa. The inputs to the first NAND gate 330 are provided by first and second inputs 332, 333. The second circuit input 333 is connected via an inverter 334 to a second input 335 of the second NAND gate 331. The first input of the second NAND gate 331 is connected to a logical high level input 336.

The end of the channel of the test branch source follower FET 320 remote from transistor 321 is connected to an address pad 346 via an off chip driver circuit 344.

The circuit described above with reference to FIG. 4 is operable in three modes, namely a first test mode in which the drain voltage range is determined, a second setting mode in which the deviation of the range is programmed to approach a desired range, and a third mode in which cells associated with the bitline 122 may be programmed.

In the first test mode the second input 333 to the first NAND gate 330 is taken low so that the output of the first NAND gate 330 goes high. As a result the interface 340 supplies a high potential to the gate of the first p-channel FET 311 which turns off, thus effectively isolating the "real" bitline circuitry associated with source follower 125 and bitline 122. As the second input 333 is inverted by inverter 334 to form the second input of the second NAND gate 331, the second input 335 is then high. As second NAND gate 331 receives a logical high at its first input, the output of the second NAND gate 331 is low, and the test p-channel FET 322 turns on via the second interface 341, thus enabling the test branch.

A load 350 typical of the current drawn by a memory cell being programmed is then applied to the address pad 346. Such a current may be for example 500 micro amps. Upon application of this load 350 to the address pad, the test source follower 320 supplies the current via the off chip driver 344 to the load. Test current loads 350 are well known in test apparatus and that shown is purely illustrative.

A voltage measuring device, such as a digital volt meter 351 is applied to the address pad 346 and the measured value of voltage is noted. Alternatively, automatic test equipment may perform these functions without operator intervention. As noted later herein, the voltage at the address pad 346 is used to characterise the loadline for the memory array.

An estimate of the effective electrical cell length is then obtained, for example by correlation to a virgin cell read current, or by use of a circuit such as that described later herein with respect to FIG. 6. A virgin cell is one that has never been programmed or electrically erased after manufacture. All cells are erased with ultra violet light (just as in an EPROM) as the last stage of the manufacturing process. This removes any charge that may be trapped on the floating gate as a consequence of manufacturing and leaves an array of erased cells. These cells exhibit a very narrow distribution of threshold voltages (−100 mV) if measured. (After electrical erasure this distribution may be of the order of approximately 2 V wide). The read current of these cells will thus also have a narrow distribution and the absolute value of read current can be related to the effective electrical length of the cell. The read current is measured after applying to the cell a voltage of a predetermined level, for example about 1 volt. A drawback of this method is that it can only be performed on cells that are erased using ultraviolet light, which takes of the order of half an hour. The address pad voltage and the effective cell length may then be applied to a look-up table, and decisions made as to whether the voltage produced by voltage regulator 126 is giving rise to an acceptable loadline, or whether the voltage produced by voltage regulator 126 requires incrementation or decrementation. If changes to the voltage regulator output are required, then in the second setting mode of operation, suitable programming voltages are applied to control input 305 of the UPROM circuitry 304, which for example may have three UPROM cells acting as latches. By use of three cells together eight different regulator outputs may be achieved.

The effect of varying the regulator output is to provide different gate voltages for application to the gate voltages of source followers 125 and 320. The effect of application of different gate voltages to a source follower FET is to cause the channel resistance of the FET 125, 320 to vary in accordance with the applied gate voltage. This in turn causes the loadline of the bitline supplied by the FET to vary.

Figure 5:
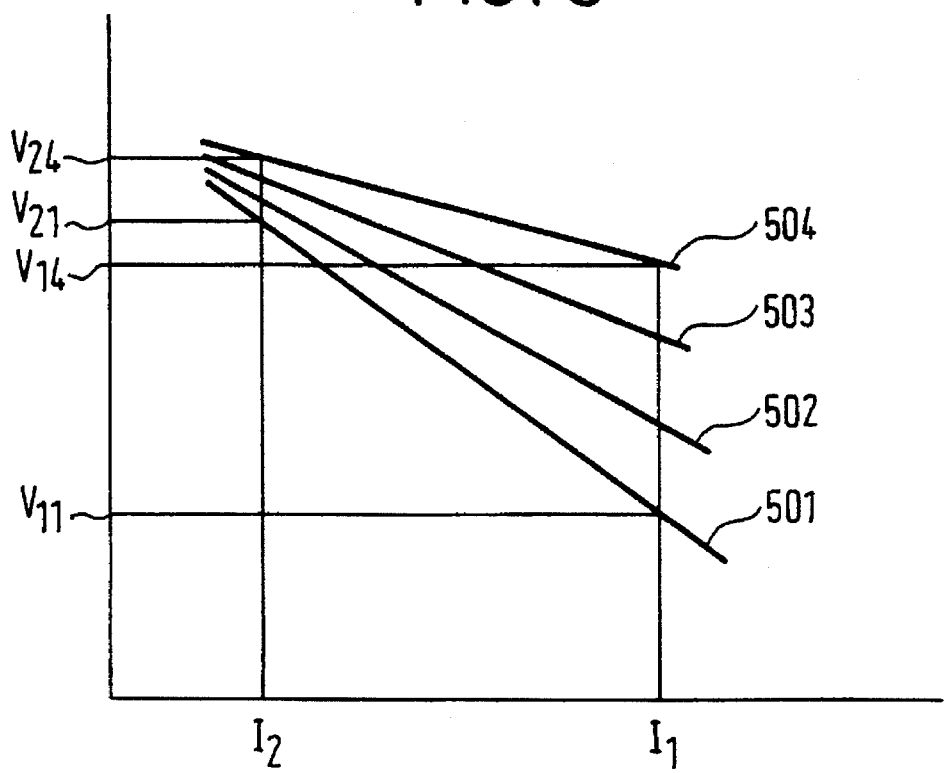
FIG. 5 is a diagrammatical representation of the bitline loadlines produced by the apparatus of FIG. 4.

Referring to FIG. 5 four such loadlines, 501, 502, 503 and 504 are shown. (Only four loadlines are shown for ease of explanation). Loadline 501 corresponds to the highest resistance source follower, in other words the lowest value of gate voltage applied. Thus, for a memory cell 120 associated with the loadline 501, an initial current I1 will give rise to an initial voltage V11 at the start of programming, and a final current I2 will give rise to a final voltage V21, at the end of programming. By contrast, the loadline 504 corresponds to the lowest value of resistance, in other words the highest gate voltage of the source follower. For the loadline 504, an initial current I1 supplied to a cell being programmed will give rise to a voltage of V14 and a final current I2 applied to the cell will produce a bitline voltage of V24 at the end of programming. Hence the voltage range 103 (see FIG. 1) will be V11–V21 for the lowest applied gate voltage, and V14–V24 for the highest applied gate voltage.

Referring once again to FIG. 4, in the third mode of operation the second input 333 to the first NAND gate 330 is taken high which causes the test p-channel FET 322 to turn off, and causes the first p-channel FET 311 to be on or off according to the state of the first input 332 to the first NAND gate 330. When the first p-channel FET 311 is on and a "program" signal is applied to input 127 of voltage regulator 126, the voltage regulator 126 produces an output voltage determined by the previously-programmed state of the UPROM circuitry 304, this voltage being applied to the "real" branch consisting of source follower FET 125 and bitline 122.

Figure 6:
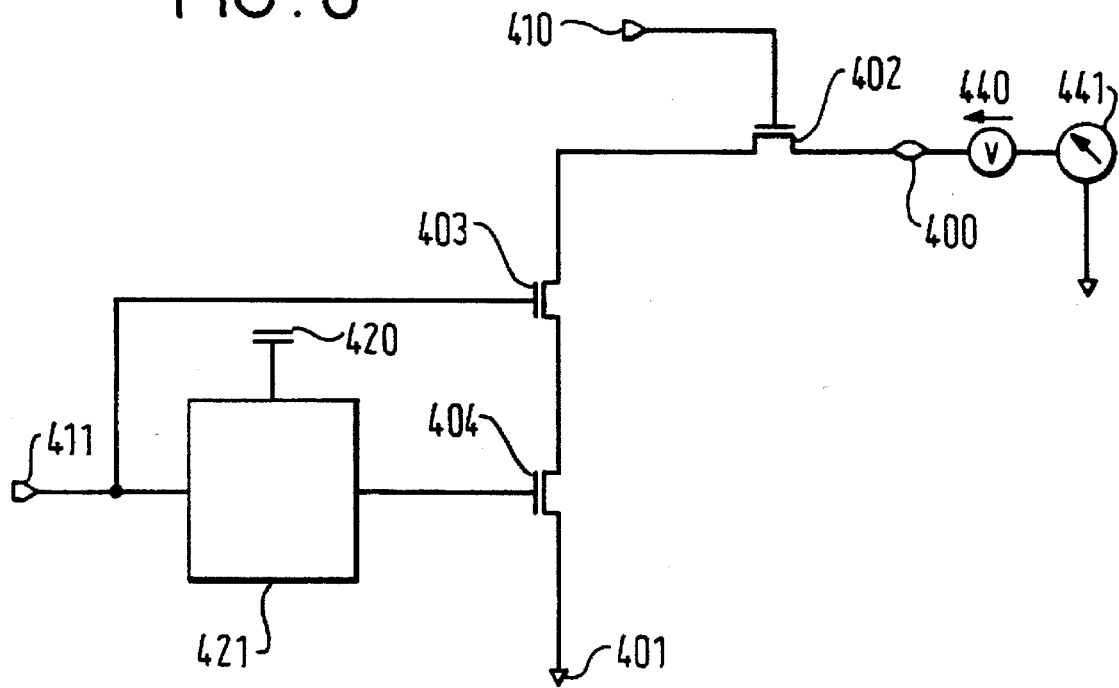
FIG. 6 shows a circuit for estimating the effective electrical length of a memory cell in a non-volatile memory array.

Referring now to FIG. 6, a terminal 400 is connected to ground potential 401 via the series connection of the channels of a first n-channel FET 402, a second n-channel FET 403 and an EPM device 404. The EPM device 404 is a device similar to, and dimensionally related to a floating gate memory cell but having a control gate galvanically coupled to the floating gate. In the present embodiment, the dimensions of the EPM device, except the width, are those of a floating gate memory cell, the width of the EPM device being about 15 times greater than that of the memory cell. The first n-channel FET 402 has a control gate connected to a first control terminal 410. The second n-channel FET 403 has a control gate connected to a second input terminal 411 and the connected gates of the EPM cell 404 are selectively connectable to a supply node 420 via a high voltage switch 421 which is also controlled from the second input terminal 411.

In operation, logical high inputs are applied to the two input terminals 410 and 411. Application of logical high voltages to the terminals 410 and 411 causes the first and second n-channel FETs to switch on. The supply node 420 of the high voltage switch is coupled to a predetermined voltage, e.g., plus 5 volts. The high input on terminal 411 causes this voltage to be applied to the gate of the EPM cell 404. A predefined potential, for example in the region of one volt, is applied by a voltage source 440 to the terminal 400 and the current flow to the terminal 400, which flows through the EPM device, is measured by a current measuring device 441, typically a digital current meter.

From the measured value of current, the transconductance of the EPM device can be calculated. Since the reciprocal of the transconductance of such a device is related to the electrical gate length, it is possible to calculate the effective electrical length of the EPM device, which is the same as that of the cells of the memory. This value is used to adjust the output of the voltage regulator 126.

Figure 7:
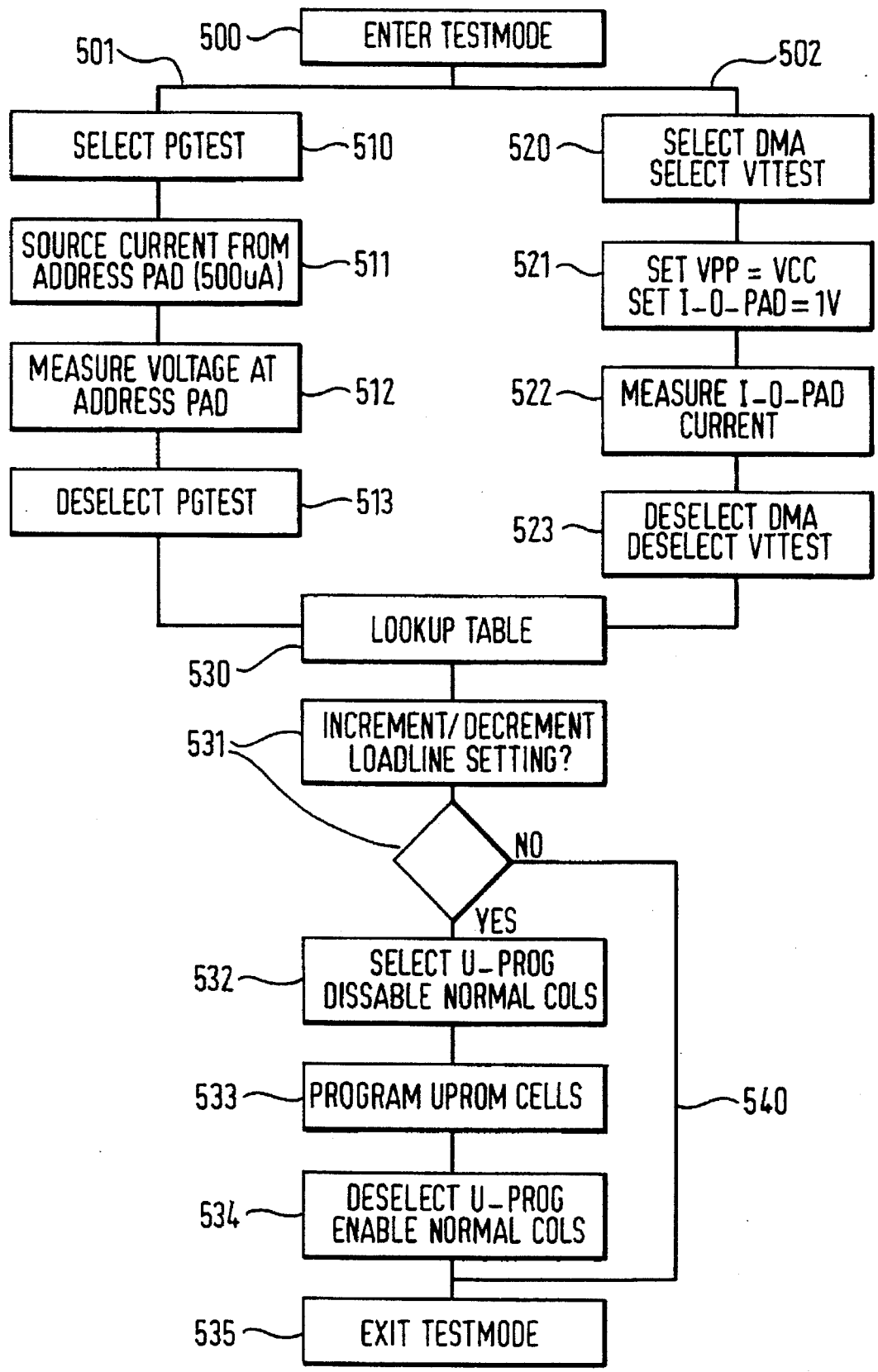
FIG. 7 shows a test flow diagram for programming the position of a loadline for a non-volatile memory cell.

Referring now to FIG. 7, a flow chart of the programming procedure described above with reference to FIGS. 4 and 6 is given.

At block 500 the programming set up is entered. The programming operation has two branches 501 and 502 corresponding to determining the actual loadline position and determining the effective electrical length of the cell respectively.

In branch 501 the test signal PGTEST applied to the second input terminal 333 of two input NAND gate 330 is taken low. In the succeeding block 511 current is drawn at the address pad 346 and in block 512 the loaded pad voltage at the address pad is measured. This measured value is recorded and in block 513 the signal PGTEST at input terminal 333 is returned to logical high.

In branch 502, the first block 520 sets the signal DMA, applied to first input terminal 410 and the signal VTTEST applied to second input terminal 411 as logical high. In the succeeding block 521, the voltage Vpp applied to terminal 420 is set to Vcc and the voltage applied to terminal IO PAD 400 is set to approximately one volt. In the next block 522, the current at terminal 400 is measured and recorded and in the last block 523 of the second branch 502, the input signals DMA and VTTEST applied to input terminals 410 and 411 are returned to logical low.

The measured values from each of the two branches, namely the voltage corresponding to the actual position of the loadline and the current corresponding to the effective electrical cell length are then fed to a look-up table 530 and on the basis of the output of this look-up table it is determined in block 531 whether it is necessary to increment or decrement the loadline setting. If a change in loadline setting is required, then all normal and redundant bitlines are disabled by deselection of transistors 311 (block 532), followed by, in block 533, programming the UPROM circuits 304. After the programming has occurred, block 534 returns the normal and redundant bitlines to operation, and deselects the programming of the UPROM circuitry. Finally in block 535, the test or programming mode is exited and normal operation can commence. If however, in block 531, no change to the loadline setting is deemed necessary, a second branch 540 passes straight to block 535.

Figure 8:
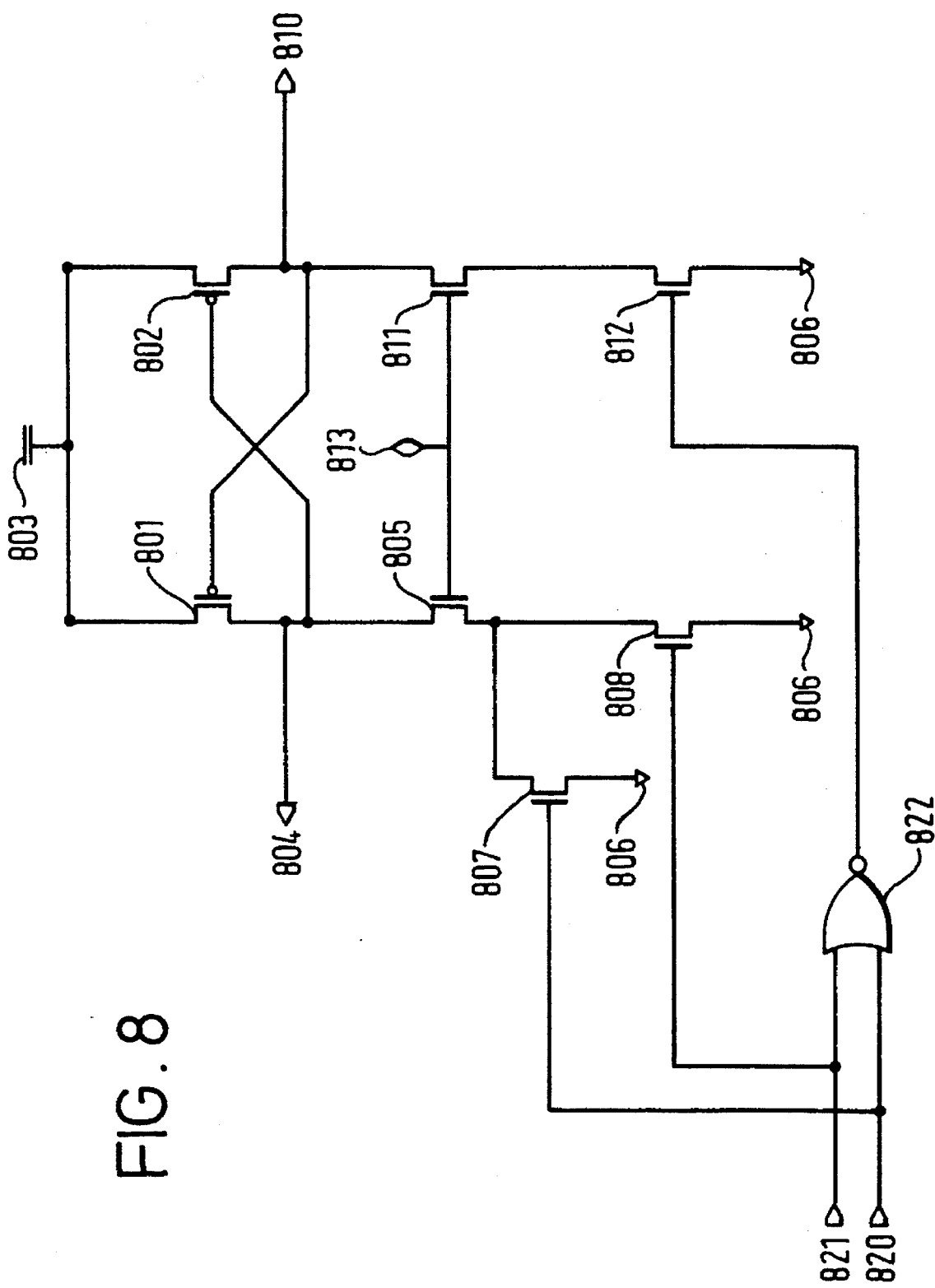
FIG. 8 is a circuit diagram of an interface circuit for use in the apparatus of FIG. 4.

An interface circuit will now be described with reference to FIG. 8 of the accompanying drawings.

The interface circuit has a pair of cross-coupled p-channel FETs 801 and 802 forming a bistable arrangement. The drains of each of the transistors 801 and 802 are connected in common to a positive supply node 803. In operation the positive supply node 803 receives a high positive voltage, for example plus 12 volts. The source of transistor 801 forms an output node 804. Output node 804 is connected to one end of the channel of a n-channel FET 805 and the other end of the channel of transistor 805 is connectable to ground 806 via the parallel-connected channels of fourth and fifth n-channel FETs 807 and 808. The source of p-FET 802 forms a second output node 810, and node 810 is connected to one end of a sixth n-FET 811. The other end of the channel of the sixth FET 811 is connected to ground 806 via the channel of a seventh FET 812. The gates of the third and sixth FETs 805, 811 are connected in common to a bias terminal 813, which in operation receives a potential sufficiently high to maintain the third and sixth FETs fully conductive. The gate of fourth FET 807 is connected to a first input terminal 820 and the gate of fifth FET 808 is connected to a second input terminal 821. The gate of seventh FET 812 is connected to the, output of a two-input NOR gate 822, to whose inputs are connected the first and second input terminals 820 and 821.

In operation, the first input terminal 820 receives an inhibit signal which has a first logical high level when the second positive supply voltage Vcc; previously described with respect to FIG. 4 herein and used elsewhere in the memory, is less than a predetermined level necessary for correct operation. The inhibit signal has a second logical low level when the second power supply voltage is within operating tolerances.

When the inhibit signal is at its logical high level, then fourth transistor. 807 is turned on, which causes first output node 804 to, be pulled towards earth via the channel of third transistor 805. As a result, the gate or the second transistor 802 is pulled to a low potential, which turns on the second transistor 802, in turn pulling the second output node 810 towards the potential of the supply node 803. The high voltage on the second output node 810 is connected to the gate of the first transistor 801 which turns first transistor 801 off Accordingly, the bistable circuit composed of cross-coupled transistors 801 and 802 is set with the output node 810 at a high level and the output node 804 at a low level. Since the current path through the fourth transistor 807 is in series with the non-conductive first transistor 801, no quiescent current flows.

The second input terminal 821 receives a control signal which has a logical high and a logical low state. When the control signal is at its logical high state, the current branch consisting of fifth transistor 808 is turned on, which once again sets the first output 804 to a low level and the second output 810 at a high level.

When both the control signal applied to terminal 821 and the inhibit signal applied to terminal 820 are at a logical low level, the NOR gate 822 produces a logical high output, which is applied to the gate of the seventh transistor, 812. Accordingly the seventh transistor 812 turns on, which has the effect of drawing the second output terminal 810 to a logical low level turning on transistor 801 to draw the first output node 804 to a logical high level and turning off the second transistor 802. Once again, since the conductive current branch through the seventh transistor 812 is in series with a non-conducting second transistor 802, no current flows.

As used in the presently described embodiments, the second output terminal 810 is connected to the gate of the associated p-FET 311 of the active load of the "real"bitline, or respectively to the gate of the p-FET 322 of the test branch active load. The first output terminal 804 is not connected.

The invention has particular advantage in a flash memory having single transistor cells with a floating gate. The operation of one type of such flash memory cell will be described hereinbelow with reference to FIGS. 9–11 of the accompanying drawings.

Figure 9:
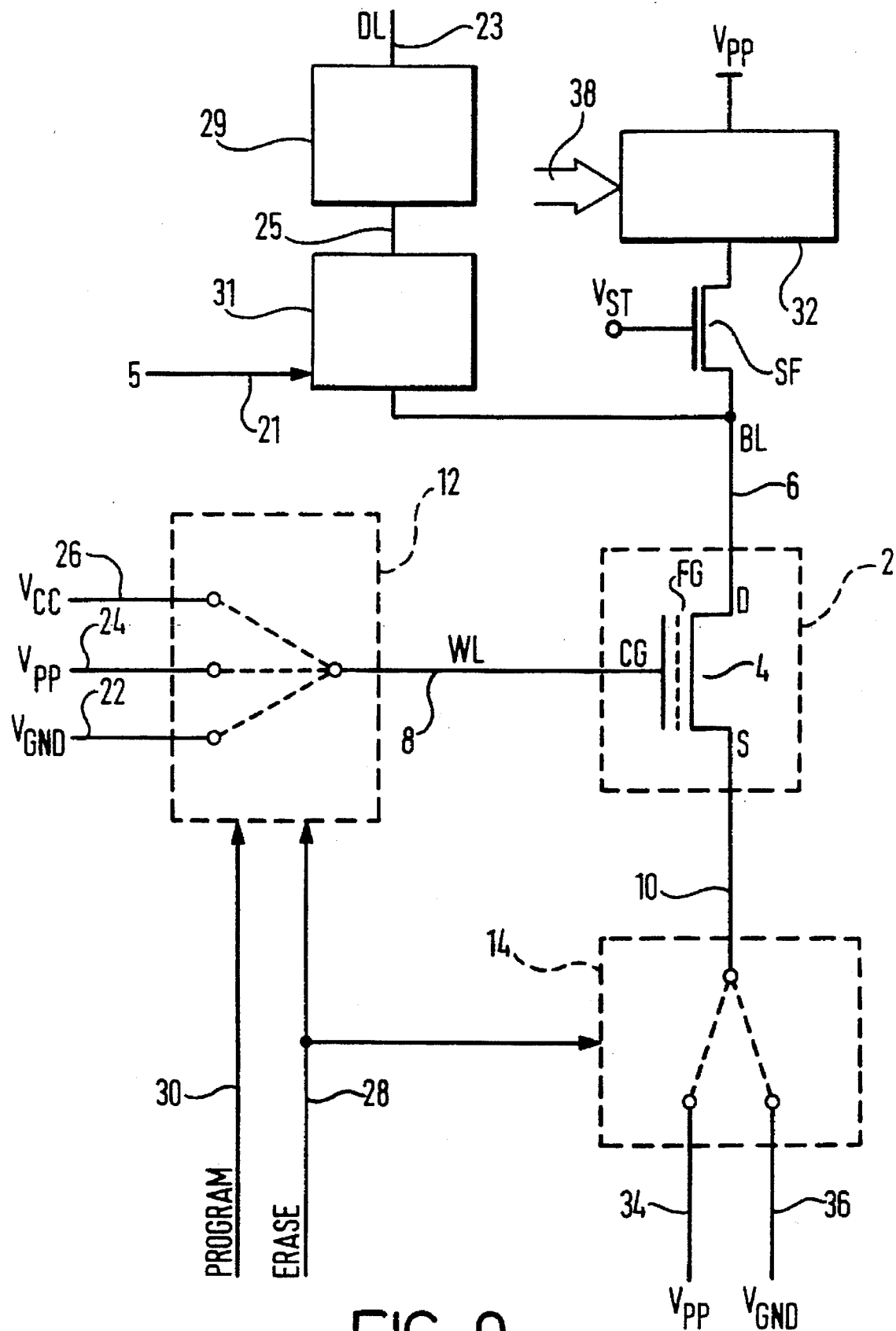
FIG. 9 is a circuit diagram showing the application of programming, erase and read voltages to a floating gate memory cell.

FIG. 9 illustrates a flash memory cell 2 comprising a single floating gate transistor 4 having a floating gate FG, control gate CG, a source S, and a drain D. The source S of the floating gate transistor 4 is connected to an ARRAY GROUND line 10. Through a source voltage switch circuit 14, line 10 is switched between an erasing potential Vpp (typically 12 V) and a device ground VGND. The source voltage switch 14 is connected to the voltage Vpp via line 34 and the voltage VGND via line 36. The control gate CG of the floating gate transistor 4 is connected to a gate voltage switch 12 by a word line (WL) 8. The gate voltage switch 12 is further connected to voltages Vcc, Vpp and VGND on lines 26, 24 and 22 respectively. Gate and source voltage switches 14 and 12 each receive a control signal ERASE on line 28 and additionally the gate voltage switch 12 receives a control signal PROGRAM on line 30. The drain D of the floating gate transistor 4 is connected to a bit line switch 31 and to a programmable load circuit 32 by a bit line (BL) 6. The bit line switch is operable to selectively couple the bit line 6 to a sense amplifier circuit 29 on line 25. The output of the sense amplifier 29 on line 23 forms a data line (DL). The bit line switch 31 receives a control signal on line 21. The programmable load circuit 32 responds to load control signals 38 to apply a voltage level of approximately 5 volts to the bit line 6 during programming of the cell.

The flash memory has three modes of operation; program, erase and read, as previously discussed. These modes will be described hereinafter with reference to FIG. 9.

During the program mode, the control signal PROGRAM on line 30 is set such that the gate voltage switch 12 connects the voltage Vpp on line 24 to the control gate CG of transistor 4 via word line 8. Because the control signal ERASE on line 28 is not set, the source voltage switch 14 connects the ARRAY ground line 10, and hence the source of transistor 4 to the voltage VGND on line 36. The control signal SELECT on line 21 is not set, and the load control signal on line 38 enables the programmable load 32. Hence the bit line 6 is connected to the programmable load 32. The load control signals 38 cause the programmable load circuit 32 in concert with current flow in the cell to produce about 5 V on the drain D of the cell transistor 4 via the bit line 6. As a result of these voltages applied to the transistor 4, electrons flow in a channel region of the transistor and charge is stored on the floating gate. Hence, the floating gate becomes negatively charged. The storage of negative charge shifts the threshold voltage of the floating gate transistor making it less conductive as programming proceeds—i.e., the channel current falls during programming. The amount of negative charge accumulated at the floating gate depends on the duration for which the control signal PROGRAM is set. By selection of a suitable duration which gives rise to a given shift of threshold, a "0" is written into the cell.

During the erase mode, the control signal ERASE on line 28 is set such that the gate voltage switch 12 connects the voltage VGND on line 22 to the control gate CG of the transistor 4 via the word line 8, and such that the switch 14 connects the voltage Vpp on line 34 to the source S of the transistor 4 via the ARRAY GROUND line 10. The load control signal 38 disables the programmable load 32 and the absence of signals on line 21 decouples the cell from the sense amplifier 29. The bit line 6 and hence the drain D of the cell transistor 4 floats. Because the floating gate transistor is fabricated such that the source region in the substrate underlies the floating gate, negative charge stored on the floating gate will be reduced as is well known in the art. The amount of negative charge removed from the floating gate depends on the duration for which the ERASE signal on line 28 is set. The reduction of negative charge shifts the threshold voltage of the floating gate transistor making it more conductive during erase—i.e., the channel current rises during erasure. By application of an erase control signal of a suitable duration substantially all the charge is removed from the floating gate and the cell is restored to "1". Normally several erase pulses are required, each erase pulse being followed by a verify cycle.

During the read mode, neither the control signal ERASE on line 28 nor the control signal PROGRAM on line 30 are set. Consequently, the Vcc potential on line 26 is connected by the gate voltage switch 12 to the control gate of the transistor 4 via the word line 8 and the voltage VGND on line 36 is connected to the source of the transistor 4 via the ARRAY GROUND line 10. Prior to a read operation the bit line 6 is precharged by the same amplifier circuit to approximately 1 volt. For an erased cell storing a logical "1", a current will be drawn by the cell when the bit line is connected for sensing. For a programmed cell storing a logical "0", no current is drawn by the cell. The current drawn (or not) by the cell is compared with a reference current to detect the logic state of the cell.

The operation of a flash cell in a memory array will now be described with reference to FIG. 10. Voltage supplies have not been illustrated in FIG. 10 for reasons of clarity, but it will be understood with reference to FIG. 10 which voltages are required in various parts of the circuit.

Figure 10:
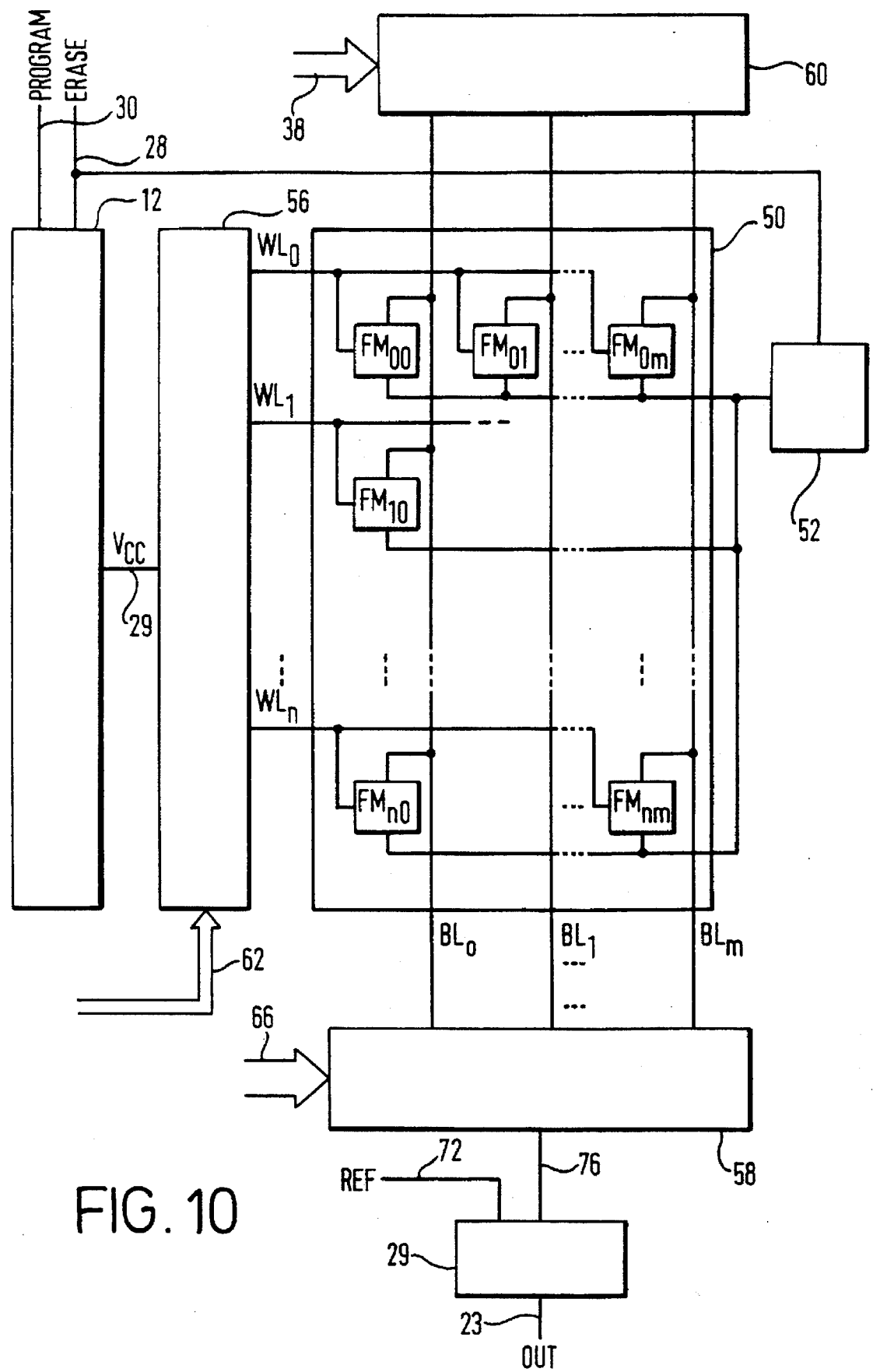
FIG. 10 is a partial block diagram of a flash memory array using floating gate memory cells.

FIG. 10 illustrates a flash memory array 50 having a plurality of flash memory cells FMoo . . . FMnm, arranged in n rows and m columns, each cell of which is similar to the cell 2 shown in FIG. 8. The gates of the transistors of, each memory cell in a row are commonly connected to a respective word line WLo . . . WLn and each word line is addressable by a word line decode circuit 56 by a row address 62. The gate voltage switch 12 responds to control signals PROGRAM and ERASE on line 30 and 28 to supply the appropriate gate voltage Vcc on line 29 to the addressed word line via row decode circuit 56.

The drains of each transistor in a respective column are commonly connected by respective bit lines BLo . . . BLm to a column line decode circuit 58. The column line decode circuit may comprise a plurality m of bit line switches 31. The output of the column line decode circuit on line 76 forms an input to a sense amplifier 29. The bit lines are also connected to bit line loading circuitry 60 which may comprise a plurality m of programmable loads 32, one for each bit line BLo . . . BLm. Each of the programmable loads 32 is controlled by load control signals 38. During a program operation the bit line loading circuitry 60 which is connected to each bit line BLo to BLm provides the previously mentioned voltage level of around 5 volts on a bit line which contains a transistor to be programmed, while the bit line loading circuitry 60 allows bit lines which contain no transistor to be programmed to be connected to ground. During an erase operation, all bit lines are allowed to float. During a read operation a selected bit line (or bit lines) is connected to the sense amplifier circuit 29, all the other bit lines being connected to ground. The sense amplifier circuit 29 also receives a reference signal REF on line 72 and generates an output signal on the data line (DL) on line 23.

It will be appreciated that when a particular cell is chosen to be programmed, the programming load will only be applied to a selected column so that cells in the same row as the selected cell are not inadvertently programmed. In addition in general during read and program operations it is desirable to apply certain signals to cells in the array which have not been selected to improve the performance of the cell, as is well known in the art. During an erase operation every cell in the memory array is erased, although it will be appreciated by a person skilled in the art that an array could be split into sectors for erasing so that only part of the array is erased at any one time. The table of FIG. 11 shows the voltages which need to be applied to the selected and unselected cells for each of a program, erase and read operation.

I claim:

1. A memory device comprising:

a bit line;

a floating gate transistor connected to the bit line;

a variable impedance device connected to the bit line and having a control terminal; and a voltage regulator connected to the control terminal of the variable impedance device and operable to apply thereto a selected voltage according to a determined effective electrical length of the floating gate transistor.

2. A non-volatile memory array having a plurality of memory cells, each cell being connected to one of a plurality of bit lines, the memory array comprising:

a variable impedance device connected to one of the plurality of bit lines and having a control terminal; and a voltage regulator connected to the control terminal of the variable impedance device and operable to apply thereto a selected voltage according to an effective electrical length of the memory cell connected to the one of the bit lines.

3. The memory array of claim 2, further comprising:

a programming circuit connected to the voltage regulator and operable to control the voltage regulator to generate the selected voltage.

4. The memory array of claim 2, further comprising:

a test circuit connected to the memory cell connected to the one of the bit lines, the test circuit operable to detect voltage and current points on a loadline from which the effective electrical length of the memory cell connected to the one of the bit lines is determined.

5. A memory cell comprising;

a floating gate transistor;

a bit line having a loadline associated therewith connected to said floating gate transistor; and a driver circuit connected to the bit line to apply a voltage to the bit line within a required voltage range during programming of the cell, said driver circuit comprising a voltage supply line, a controlled variable impedance circuit connected between the voltage supply line and the bit-line and having a control node for controlling the impedance of the variable impedance circuit, and control voltage selector circuitry connected to the control node to select a voltage to be applied to the control node according to an effective electrical length of the memory cell and thereby control the loadline of the bit line.

6. A method of controlling a loadline of a bitline in a floating gate transistor memory cell, said bitline having bitline driver circuitry receiving a control voltage which may be varied to alter the loadline position, the method comprising the following steps:

determining the effective electrical length of the cell transistor; and programming the control voltage applied to the bitline driver circuitry in dependence on the effective transistor length whereby a desired loadline may be achieved.

7. A voltage control circuit for controlling a bit line voltage of a memory cell in a flash memory array, the circuit comprising:

variable impedance circuitry connected between a voltage supply and the bit line, the variable impedance circuitry having a control node;

voltage regulator circuitry for regulating a voltage applied to the control node to vary the impedance of the variable impedance circuitry; and programming circuitry connected to the voltage regulator circuitry, for selecting the voltage applied by the voltage regulator circuitry to the control node according to an effective electrical length of the memory cell, whereby the impedance of the variable impedance circuitry may be selected.

8. A non-volatile memory array comprising:

a plurality of memory cells, each cell being coupled at a first terminal thereof to a respective one of a plurality of bit lines whereby a programming voltage may be applied to selected cells;

each of said bit lines having a variable impedance circuit for providing said programming voltage, connected between a voltage supply and the respective bit line, each variable impedance circuit having a respective control node;

voltage regulator circuitry for applying a voltage to each control node; and control circuitry for selecting the value of said voltage according to an effective electrical length of the plurality of memory cells, whereby said voltage may be set after manufacture of said array.

9. The non-volatile memory array of claim 8 having loadline test circuitry for detection of a voltage and current point on an actual loadline whereby the control voltage may be selected.

10. The non-volatile memory array of claim 9 wherein said loadline test circuitry comprises a test variable impedance circuit having a control node coupled to said voltage regulator circuitry.

11. The non-volatile memory array of claim 8 wherein each cell comprises a floating gate transistor and having cell length test circuitry for determining the effective electrical length of a transistor whereby the control voltage may be selected.

12. The non-volatile memory array of claim 11 wherein said cell length test circuitry comprises a cell having a floating gate and a control gate, said floating gate and said control gate being shorted together.

13. The non-volatile memory array of claim 8 wherein the control circuitry has memory circuitry programmable to set the value of said voltage.

14. The non-volatile memory array of claim 13 wherein the memory circuitry comprises at least one UPROM cell.

15. The non-volatile memory array of claim 8 having connection circuitry for selectively connecting the variable impedance circuitry to the voltage supply whereby said selected cells may be programmed, and wherein each cell has a second terminal selectively connected to the voltage supply for programming said selected cells.

16. The non-volatile memory array of claim 15 wherein each cell has a third terminal for selective connection to a voltage supply to erase each cell.

17. A method of determining a loadline of a line driver in an integrated circuit, said line driver having a control node, the method comprising:

providing a test line driver, having a control node;

applying a control signal to the control nodes of said line driver and said test line driver;

applying a predetermined current sink to an output of the test line driver; and measuring the voltage at said output as a measure of said loadline.

18. A method of determining the effective electrical length of a floating gate memory cell comprising the following steps:

providing a test cell comprising a memory cell having a floating gate and a control gate galvanically connected together, and a channel;

supplying a predetermined voltage to the control gate of the test cell;

applying a predetermined voltage across the channel of the test cell; and measuring the current flow through the test cell to establish the transconductance thereof whereby the effective electrical cell length-may be computed.

19. A circuit for measuring the effective electrical length of a floating gate memory cell, the circuit comprising:

an EPM device, said EPM device being a memory cell having a channel, a floating gate and a control gate, the floating gate being galvanically connected to the control gate;

test circuitry for applying a predetermined potential to the control gate of the EPM device and for applying a predetermined potential across the channel of the EPM device; and measuring circuitry for measuring the current flow through the EPM device, for determining the transconductance of the EPM device whereby the effective electrical cell length may be determined.

20. The memory cell of claim 1 wherein the variable impedance device is a field effect transistor having a gate defining the control terminal.

21. A non-volatile memory array comprising:

a plurality of memory cells, each cell being coupled at a first terminal thereof to a respective one of a plurality of bit lines whereby a programming voltage may be applied to selected cells;

each of said bit lines having a variable impedance circuit for providing said programming voltage, connected between a voltage supply and the respective bit line, each variable impedance circuit having a respective control node;

voltage regulator circuitry for applying a voltage to each control node;

control circuitry for selecting the value of said voltage, whereby said voltage may be set after manufacture of said array; and loadline test circuitry for detection of a voltage and current point on an actual loadline whereby the control voltage may be selected.

22. The non-volatile memory array of claim 21 wherein said loadline test circuitry comprises a test variable impedance circuit having a control node coupled to said voltage regulator circuitry.

23. A non-volatile memory array comprising:

a plurality of memory cells, each cell being coupled at a first terminal thereof to a respective one of a plurality of bit lines whereby a programming voltage may be applied to selected cells;

each of said bit lines having a variable impedance circuit for providing said programming voltage, connected between a voltage supply and the respective bit line, each variable impedance circuit having a respective control node;

voltage regulator circuitry for applying a voltage to each control node; and control circuitry for selecting the value of said voltage, whereby said voltage may be set after manufacture of said array;

wherein each cell comprises a floating gate transistor; and cell length test circuitry for determining the effective electrical length of the transistor whereby the control voltage may be selected.

24. The non-volatile memory array of claim 23 wherein said cell length test circuitry comprises a cell having a floating gate and a control gate, said floating gate and said control gate being shorted together.

25. A non-volatile memory array comprising:

a plurality of memory cells, each cell being coupled at a first terminal thereof to a respective one of a plurality of bit lines whereby a programming voltage may be applied to selected cells;

each of said bit lines having a variable impedance circuit for providing said programming voltage, connected between a voltage supply and the respective bit line, each variable impedance circuit having a respective control node;

voltage regulator circuitry for applying a voltage to each control node;

control circuitry for selecting the value of said voltage, whereby said voltage may be set after manufacture of said array; and wherein the control circuitry has memory circuitry programmable to set the value of said voltage.

26. The non-volatile memory array of claim 25 wherein the memory circuitry comprises at least one UPROM cell.

* * * * *

UNITED STATES PATENT AND TRADEMARK OFFICE
CERTIFICATE OF CORRECTION

| | | |
|---|---|---|
| PATENT NO. | : 5,652,722 | Page 1 of 1 |
| APPLICATION NO. | : 08/519194 | |
| DATED | : July 29, 1997 | |
| INVENTOR(S) | : Colin Whitfield | |

It is certified that error appears in the above-identified patent and that said Letters Patent is hereby corrected as shown below:

Title Page,

Item (75):
"Colin Whitefield, Bristol, United Kingdom" should read, --Colin Whitfield, Bristol, United Kingdom--.

Signed and Sealed this
Twenty-eighth Day of May, 2013

Teresa Stanek Rea
*Acting Director of the United States Patent and Trademark Office*